(12) United States Patent
Yan et al.

(10) Patent No.: US 8,298,618 B2
(45) Date of Patent: Oct. 30, 2012

(54) PREPARATION METHOD OF COMPOSITE LUMINESCENT THIN FILM OF SULFONATED POLY (P-PHENYLENE) AND LAYERED DOUBLE HYDROXIDES

(75) Inventors: Dongpeng Yan, Beijing (CN); Jun Lu, Beijing (CN); Min Wei, Beijing (CN); Xue Duan, Beijing (CN)

(73) Assignee: Beijing University of Chemical Technology, Beijing (CN)

( * ) Notice: Subject to any disclaimer, the term of this patent is extended or adjusted under 35 U.S.C. 154(b) by 635 days.

(21) Appl. No.: 12/459,795

(22) Filed: Jul. 7, 2009

(65) Prior Publication Data

US 2010/0219378 A1 Sep. 2, 2010

(30) Foreign Application Priority Data

Mar. 2, 2009 (CN) .......................... 2009 1 0078711

(51) Int. Cl.
| | | |
|---|---|---|
| *B05D 5/00* | (2006.01) | |
| *B05D 7/24* | (2006.01) | |
| *B05D 1/18* | (2006.01) | |
| *B05D 1/38* | (2006.01) | |

(52) U.S. Cl. ..................... 427/419.1; 427/64; 427/430.1
(58) Field of Classification Search .................. 427/402, 427/407.1, 407.2, 419.1–419.8, 430.1, 64, 427/74
See application file for complete search history.

(56) References Cited

OTHER PUBLICATIONS

Kerr et al., "Surfactant-Mediated Incorporation of Poly(p-phenylene) into MoO3," Chem. Mater. 1998, 10, 2588-2591.*
Taviot-Gueho et al., "In Situ Polymerization and Intercalation of Polymers in Layered Double Hydroxides," Struct Bond (2006) 119: 121-159.*

* cited by examiner

*Primary Examiner* — William Phillip Fletcher, III
(74) *Attorney, Agent, or Firm* — Blakely, Sokoloff, Taylor & Zafman LLP

(57) ABSTRACT

A preparation method of composite blue luminescent thin film of sulfonated poly(p-phenylene) (i.e. poly[2,5-bis(3-sulfonatopropoxy)-1,4-phenylene-alt-1,4-phenylene]) and LDHs (Layered Double Hydroxides) is disclosed. The preparation method comprises the following steps: preparing delaminated LDHs colloidal solution using formamide solvent, preparing sulfonated poly(p-phenylene) aqueous solution, and performing alternate assembling on hydrophilically treated substrate in the two solutions to give the composite thin film of sulfonated poly(p-phenylene)/LDHs multilayer. The preparation method has the advantages of simple preparation process, and film thickness controllable at nanoscale precision, in addition, this method also achieves the immobilization of luminescent polymer via restricted space among LDHs layers and host-guest interaction, effectively improves thermal stability, and reduces fluorescence quenching caused by aggregation.

3 Claims, 2 Drawing Sheets

US 8,298,618 B2

PREPARATION METHOD OF COMPOSITE LUMINESCENT THIN FILM OF SULFONATED POLY (P-PHENYLENE) AND LAYERED DOUBLE HYDROXIDES

CROSS-REFERENCE TO RELATED APPLICATIONS

The present patent application claims priority from Chinese Patent Application No. 200910078711.X, filed on Mar. 2, 2009.

FIELD OF THE INVENTION

The present invention relates to the field of inorganic-organic composite luminescent material, and particularly provides a preparation method of composite luminescent thin film of sulfonated poly (p-phenylene) anion and layered double hydroxides.

BACKGROUND OF THE INVENTION

Owing to advantages of low cost, good flexibility, low operation voltage, and high quantum efficiency, conjugated polymer luminescent materials have become research hotspot worldwide for the past decades, particularly drawn great attention due to their wide application prospects in the field of light emitting diode. However, conjugated polymer materials still have a lot of shortcomings in device implementation process, such as short device service life, and fluorescence quenching caused by interaction among polymer molecules. At the same time, routine spinning method for preparing polymer luminescent film can not control film thickness and homogeneity, and thus leads to poor device stability and efficiency.

Double-metal hydroxide, also called layered double hydroxides (LDHs), is a novel multifunctional layered material, and has the advantages of ion-exchange ability and adjustable metal element of laminar layer, etc. By mechanically stirring in organic solvent, LDHs can be delaminated into highly dispersed single-layer nanosheet laminas which can be self assembled into supermolecule thin film via electrostatic force, hydrogen bond, or hydrophilicity/hydrophobicity. Therefore, molecular structural units with different functional characteristics can be assembled into orderly arranged microdevice with different functions and structures by this layer-by-layer self assembly method.

Inorganic/organic composite ultrathin film formed by alternating assembly of luminescent polymer with negative charges and LDHs is beneficial for achieving molecular-scale oriented arrangement and uniform dispersion of luminescent polymer molecules to eliminate fluorescence quenching, and is also beneficial for improving physical and chemical stability of luminescent polymer. Poly(p-phenylene) is an important organic polymer blue luminescent material with the characteristics of high quantum efficiency and high rigidity. But the research regarding ultrathin film formed by assembly of poly(p-phenylene) and LDHs has not been reported until now.

SUMMARY OF THE INVENTION

The object of the present invention is to provide a composite blue luminescent thin film formed by sulfonated poly(p-phenylene) (i.e. poly[2,5-bis(3-sulfonatopropoxy)-1,4-phenylene-alt-1,4-phenylene]) and LDHs, and its preparation method. The invention not only improves optical and thermal stability of luminescent polymer, but also applies LDHs as a novel material on assembly of conjugated polymer, so as to provide a solution for molecular-scale uniform dispersion of luminescent polymer. The technical scheme of the present invention is to form uniformly dispersed luminescent polymer/LDHs supramolecular layered material through layer-by-layer assembly of poly(p-phenylene) derivatives as luminescent polymer and LDHs nanosheet delaminated in organic solvent. The composite material can fully utilize restricted space among LDHs layers and host-guest interaction to achieve the immobilization of luminescent polymer while effectively improving mechanical strength and physical and chemical stability of the polymer.

The process for preparing composite luminescent thin film of sulfonated poly(p-phenylene) anion/layered double hydroxides, comprising following steps:

1) Preparing nitrate-intercalated LDHs by coprecipitation method or ion-exchange method, in which the coprecipitation method comprises the following substeps:

a1. Preparing a mixed nitrate solution containing soluble divalent metal cation $M^{2+}$ and soluble trivalent metal cation $M^{3+}$ with $M^{2+}/M^{3+}$ molar ratio of 2-4 and $M^{2+}$ concentration of 0.1-1 mol/L;

b1. Preparing NaOH or KOH solution, wherein molar ratio of NaOH or KOH/sum of $M^{2+}$ and $M^{3+}$ in substep a1 is 2-2.5; and c1. Under stirring, slowly dropwise adding the mixed nitrate solution obtained in substep a1 into the NaOH or KOH solution obtained in substep b1 under $N_2$ protection, regulating pH of the resulting solution to 7-10 by using 1-5 mol/L NaOH solution, crystallizing at 60° C.-70° C. for 12-24 hr, and recovering the nitrate-intercalated LDHs from crystallization product, and the ion-exchange method comprises following substeps:

a2. Preparing mixed nitrate solution containing soluble divalent metal cation $M^{2+}$ and soluble trivalent metal cation $M^{3+}$ with $M^{2+}/M^{3+}$ molar ratio of 2-4 and $M^{2+}$ concentration of 0.1-1 mol/L;

b2. Preparing urea solution, wherein urea/ sum of $M^{2+}$ and $M^{3+}$ molar ratio is 3-5;

c2. Allowing the mixed nitrate solution obtained in substep a1 and the urea solution obtained in substep b2 to react at 100-150° C. for 12-36 hr in Polytetrafluoroethylene(PTFE)-lined pressure reactor, and recovering carbonate-intercalated LDHs from reaction product; and d2. Allowing sodium nitrate and the carbonate-intercalated LDHs at mass ratio of 200:1-500:1 to carry out ion-exchange reaction for 12-24 hr under inert gas protection, and recovering nitrate-intercalated LDHs from the reaction product;

2) In formamide solvent per 100 ml, stirring 0.05-0.2 g of nitrate intercalated LDHs obtained in step 1) at 3,000-5,000 rpm to delaminate for 12-36 hr, centrifuging delaminated LDHs solution, and discarding the precipitate to obtain clear transparent colloidal solution;

3) Preparing 0.1-1 g/L sulfonated poly(p-phenylene) solution;

4) Subjecting substrate to hydrophilic treatment, soaking it in the colloidal solution obtained in step 2) for 10-20 min, fully washing with deionized water, placing in sulfonated poly(p-phenylene) solution in 3), soaking for 10-20 min, and fully washing with deionized water to obtain one-cycle composite thin film of sulfonated poly (p-phenylene)/LDHs; and 5) Repeating step 4) to obtain multilayer composite thin film of sulfonated poly (p-phenylene)/LDHs.

Wherein in substep b1, the concentration of NaOH or KOH solution can be 0.025-1 mol/L, preferably 0.05-0.5 mol/L.

In substep c1, the stirring speed can be 1,000-5,000 rpm, preferably 1,000-2,000 rpm.

In substep c1, recovering nitrate intercalated LDHs from crystallization product can be carried out by routine separation method, preferably, by subjecting crystallization product to solid-liquid separation, washing the obtained solid product with $CO_2$-free deionized water to neutral, centrifuging, drying the obtained filter cake at 50-80° C. for 12-24 hr. The solid-liquid separation method is preferably centrifugation, and the temperature of the $CO_2$-free deionized water is preferably 40-70° C.

In substep b2, the concentration of the urea solution can be 0.375-1 mol/L, preferably 0.4-0.6 mol/L.

In substep c2, the pressure in the pressure reactor can be 8-15 MPa.

In substep c2 or d2, recovering obtained LDHs from reaction product can be carried out by routine separation method, preferably, by subjecting reaction product to solid-liquid separation, washing the obtained solid product with $CO_2$-free deionized water to neutral, centrifuging, drying the obtained filter cake at 50-80° C. for 12-24 hr. The solid-liquid separation method is preferably centrifugation, and the temperature of the $CO_2$-free deionized water is preferably 40-70° C.

In step d2, the ion-exchange reaction process may comprise: dissolving carbonate intercalated LDHs 0.3 g and solid $NaNO_3$ 0.75 mol in $CO_2$-free deionized water, uniformly dispersing, adding concentrated nitric acid, and performing ion-exchange reaction under nitrogen atmosphere at 25° C. while stirring. The usage amount of the deionzed water can be 300-500 ml, and the usage amount of the concentrated nitric acid can be 0.07-0.09 ml.

Ion-exchange reaction temperature can be 20-50° C., preferably 20-40° C.

In step 4), the substrate is preferably quartz, silicon wafer or glass sheet; and the hydrophilic treatment comprises soaking the substrate in concentrated $H_2SO_4$ for 30-50 min, and fully washing with deionized water.

In step 1), the $M^{2+}$ is $Mg^{2+}$, $Co^{2+}$, $Ni^{2+}$, $Ca^{2+}$, $Cu^{2+}$, $Fe^{2+}$ or $Mn^{2+}$; $M^{3+}$ is $Al^{3+}$, $Cr^{3+}$, $Ga^{3+}$, $In^{3+}$, $Co^{3+}$, $Fe^{3+}$ or $V^{3+}$.

The present invention has the advantages that restricted space among LDHs layers and host-guest interaction are utilized to orderly assemble sulfonated poly(p-phenylene) anions as conjugated polymer luminescent material and LDHs layers to achieve the immobilization of luminescent polymer while making it uniformly dispersed in LDHs layers, and thus effectively reduce fluorescence quenching caused by polymer aggregation, which provides fundamental application research for application of LDHs in the field of luminescent material.

DETAILED DESCRIPTION OF THE EMBODIMENTS

EXAMPLE 1

1. Preparation of nitrate intercalated LDHs by coprecipitation method:
    a. Dissolving 0.015 mol of solid Mg $(NO_3)_2.6H_2O$ and 0.0075 mol of solid $Al(NO_3)_3.9H_2O$ in 50 mL of $CO_2$-free deionized water;
    b. Dissolving 0.0625 mol of NaOH in 50 ml of $CO_2$-free deionized water;
    c. Placing the alkali solution prepared in step b in four-neck flask, intensive stirring at 1,500 rpm under nitrogen gas protection while slowly dropwise adding the salt solution prepared in step a into the four-neck flask within 0.5 h, regulating pH to 8 with 5 mol/L NaOH solution after dropwise addition, reacting in 60° C. water bath for 24 h, centrifuging, washing with 60° C. $CO_2$-free deionized water to pH of 7, centrifuging, and drying at 70° C. for 24 h to obtain Mg—Al type nitrate-intercalated LDHs;
2. Adding 0.1 g of the nitrate-intercalated LDHs in 100 ml of formamide solvent, stirring at 3,000 rpm for 24 h, centrifuging the delaminated LDHs solution, and discarding the precipitate to give clear transparent colloidal solution A;
3. Preparing 1 g/L sulfonated poly(p-phenylene) aqueous solution B;
4. Subjecting substrate to hydrophilic treatment (soaking in concentrated sulfuric acid for 30 min, then fully washing with deionized water), soaking in the solution A for 10 min, fully cleaning with deionized water, placing in the solution B, soaking for 10 min, and fully washing with deionized water to obtain one-cycle composite film of sulfonated poly(p-phenylene)/LDHs;
5. Repeating step 4 to obtain multilayer composite film of sulfonated poly (p-phenylene)/LDHs.

Figure 1:
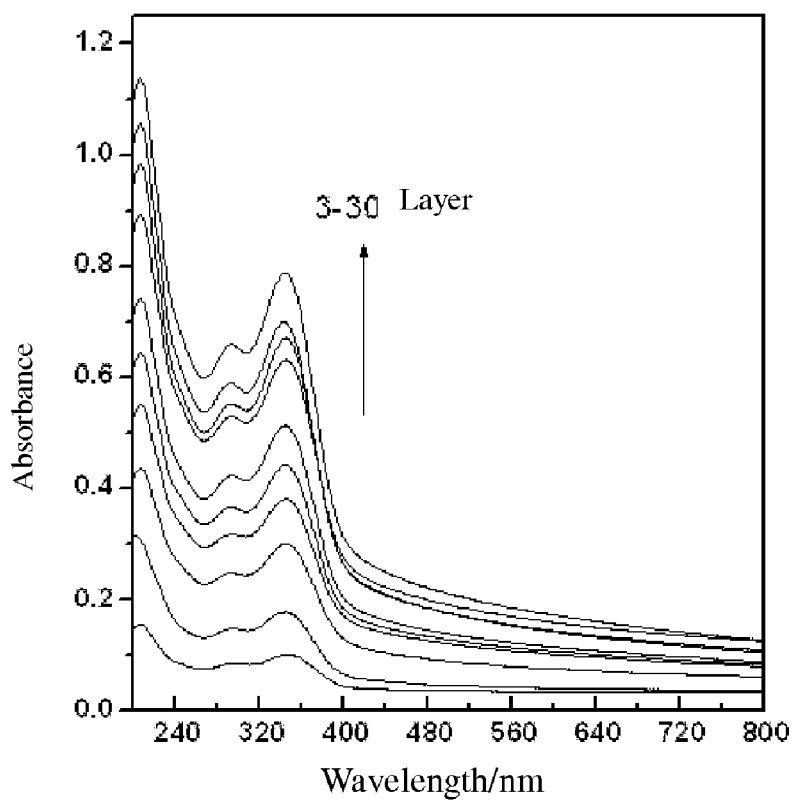
FIG. 1 is the UV-vis absorption spectra of composite thin film of sulfonated poly(p-phenylene)/LDHs with assembly layers of 3-30 obtained in example 1, showing the result of UV-vis spectroscopy performed once every 3 layers.
Figure 2:
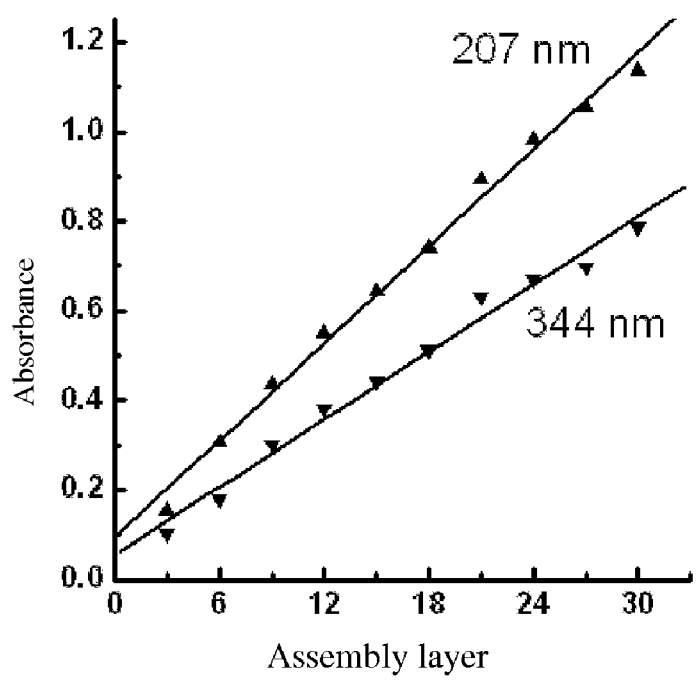
FIG. 2 shows variation of absorbance at 207 nm and 344 nm along with increase of assembly layers in FIG. 1.

The product is characterized by UV-2501PC UV-vis spectrophotometer (SHIMADZU, Japan). It can be observed from FIG. 1 that the maximum absorption peaks continuously increase along with increase of assembly layers of the composite thin film of sulfonated poly(p-phenylene)/LDHs; and as shown in FIG. 2, the absorbance is almost in linear relationship with assembly layer number, which indicates that sulfonated poly(p-phenylene) amount for each assembly is a fixed value.

EXAMPLE 2

1. Preparation of nitrate-intercalated LDHs by ion-exchange method:
    a. Dissolving 0.01 mol of solid Mg $(NO_3)_2.6H_2O$ and 0.005 mol of solid $Al(NO_3)_3.9H_2O$ in 50 mL of deionized water to give nitrate solution; dissolving 0.06 mol of urea in 50 ml of deionized water to give urea solution; allowing the nitrate solution and the urea solution to carry out crystallization reaction under 100° C. for 12 hr in PTFE (Polytetrafluoroethylene)-lined pressure reactor, centrifuging, washing with deionized water to pH of 7, centrifuging, and drying at 70° C. for 12 h to obtain carbonate-intercalated LDHs;
    b. Dissolving the above carbonate-intercalated LDHs 0.3 g and solid $NaNO_3$ 63.75 g in 300 ml of $CO_2$-free deionized water, uniformly dispersing, adding concentrated nitric acid 0.08 ml, carrying out ion-exchange reaction for 12 h at 25° C. under nitrogen gas atmosphere while stirring, centrifuging, washing with 60° C. $CO_2$-free deionized water to pH of 7, centrifuging, and drying at 70° C. for 18 h to obtain Mg—Al type nitrate-intercalated LDHs.

2. Adding 0.1 g of the nitrate-intercalated LDHs in 100 ml of formamide solvent, stirring at 4,000 rpm for 24 h under nitrogen gas atmosphere, centrifuging the delaminated LDHs solution, and discarding the precipitate to give clear transparent colloidal solution A;

3. Preparing 0.5 g/L sulfonated poly(p-phenylene) aqueous solution B;

4. Subjecting substrate to hydrophilic treatment, soaking in the solution A for 15 min, fully washing with deionized water, placing in the solution B, soaking for 15 min, and fully washing with deionized water to obtain one-cycle composite thin film of sulfonated poly(p-phenylene)/LDHs;

5. Repeating step 4 to obtain multilayer composite thin film of sulfonated poly (p-phenylene)/LDHs.

Figure 3:
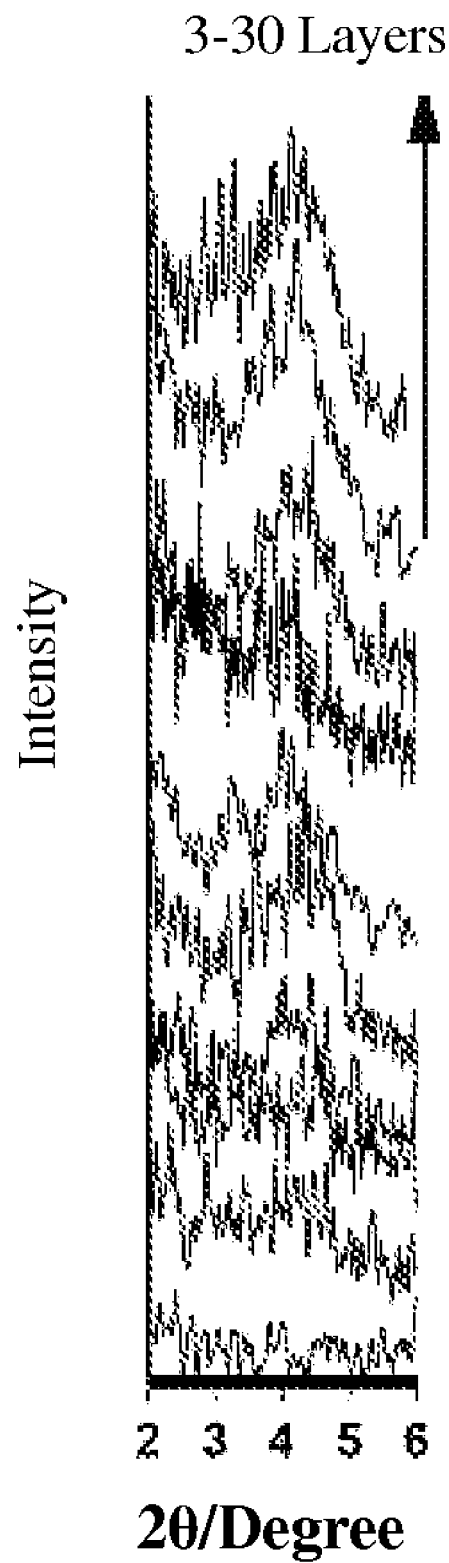
FIG. 3 is the XRD pattern performed once every 3 layers of composite thin film of sulfonated poly(p-phenylene)/LDHs with assembly layers of 3-30 obtained in example 2.

The product is characterized by D/Max 2000 VPC+XRD spectrometer (Rigaku, Japan). It can be observed from XRD spectra in FIG. 3 that sulfonated poly(p-phenylene) and LDHs are orderly assembled successfully, and the intensity of XRD peak of the composite thin film increases along with increase of assembly layers of the composite thin film of sulfonated poly(p-phenylene)/LDHs, in which 003 peak in XRD spectra appears at 4.0°, and the calculated interlayer distance is about 2 nm, which indicates that interference of carbonate entering into LDHs layers has been eliminated, and also indicates that sulfonated poly(p-phenylene)is orderly arranged among LDHs layers.

What is claimed is:

1. A process for preparing a composite luminescent film of sulfonated poly(p-phenylene) anion/layered double hydroxides (LDHs), comprising:
   1) preparing nitrate-intercalated LDHs by a coprecipitation method or an ion-exchange method, wherein the coprecipitation method comprises:
      preparing a mixed nitrate solution containing a soluble divalent metal cation $M^{2+}$ and a soluble trivalent metal cation $M^{3+}$ with a molar ratio $M^{2+}/M^{3+}$ of 2-4 and $M^{2+}$ concentration of 0.1-1 mol/L;
      preparing a solution of NaOH or KOH, wherein the molar ratio of NaOH or KOH to the sum of $M^{2+}$ and $M^{3+}$ being 2-2.5; and
      under stirring, slowly dropwise adding the mixed nitrate solution into the NaOH of KOH solution under $N_2$ protection, regulating the pH of the resulting solution to 7-10 with 1-5 mol/L NaOH solution, crystallizing at 60° C-70° C. for 12-24 hours, and recovering the nitrate-intercalated LDHs from the crystallization product, and wherein the ion-exchange method comprises:
      preparing a mixed nitrate solution containing a soluble divalent metal cation $M^{2+}$ and a soluble trivalent metal cation $M^{3+}$ with a molar ratio $M^{2+}/M^{3+}$ of 2-4 and $M^{2+}$ concentration of 0.1-1 mol/L;
      preparing a urea solution, wherein the molar ratio of urea to the sum of $M^{2+}$ and $M^{3+}$ is 3-5;
      reacting the mixed nitrate solution and the urea solution at 100° C.-150° C. for 12-36 hours in a PTFE-lined pressure reactor, and recovering carbonate-intercalated LDHs from the reaction product; and
      carrying out an ion-exchange reaction between sodium nitrate and the carbonate-intercalated LDHs at a mass ratio of 200:1-500:1 for 12-24 hours under inert gas protection, and recovering nitrate-intercalated LDHs from the reaction product;
   2) stirring, in formaldehyde solvent per 100 mL, 0.05-0.2 g of nitrate intercalated LDHs at 3,000-5,000 rpm for 12-36 hours to delaminate, centrifuging the delaminated LDHs solution and discarding the precipitate to obtain a clear transparent colloidal solution;
   3) preparing 0.1-1 g/L sulfonated poly(p-phenylene) solution;
   4) subjecting a substrate to hydrophilic treatment, soaking said treated substrate in the colloidal solution for 10-20 min, fully washing with deionized water, then placing the substrate in the sulfonated poly(p-phenylene) solution, and soaking it for 10-20 min, and fully washing with deionized water to obtain a one-cycle composite film of sulfonated poly(p-phenylene)/LDHs; and
   5) repeating soaking the substrate in the colloidal solution for 10-20 min, fully washing with deionized water, then placing the substrate in the sulfonated poly(p-phenylene) solution, and soaking it for 10-20 min, and fully washing with deionized water, to obtain a multilayer composite film of sulfonated poly(p-phenylene)/LDHs.

2. The process according to claim 1, wherein $M^{2+}$ is $Mg^{2+}$, $Co^{2+}$, $Ni^{2+}$ $Ca^{2+}$, $Cu^{2+}$, $Fe^{2+}$ or $Mn^{2+}$, and $M^{3+}$ is $Al^{3+}$, $Cr^{3+}$, $Ga^{3+}$, $In^{3+}$, $CO^{3+}$, $Fe^{3+}$ or $V^{3+}$.

3. The process according to claim 1, wherein the substrate is selected from the group consisting of: quartz, silicon wafer, and glass sheet, and the hydrophilic treatment comprises soaking the substrate in concentrated $H_2SO_4$ for 30-50 min, and fully washing with deionized water.

* * * * *